United States Patent
Kang et al.

(10) Patent No.: US 8,660,439 B2
(45) Date of Patent: Feb. 25, 2014

(54) DIGITAL AUTOMATIC GAIN CONTROL APPARATUS AND METHOD IN BURST MODE OPTICAL RECEIVER

(75) Inventors: Ho-Yong Kang, Daejeon (KR); Hyun-Kyun Choi, Daejeon (KR); Quan Le, Daejeon (KR); Yool Kwon, Busan (KR); Bong-Tae Kim, Daejeon (KR); Sang-Gug Lee, Daejeon (KR)

(73) Assignees: Electronics and Telecommunications Research Institute (KR); Research and Industrial Cooperation Group (KR)

( * ) Notice: Subject to any disclaimer, the term of this patent is extended or adjusted under 35 U.S.C. 154(b) by 858 days.

(21) Appl. No.: 12/086,225

(22) PCT Filed: Dec. 5, 2006

(86) PCT No.: PCT/KR2006/005213
§ 371 (c)(1),
(2), (4) Date: Sep. 21, 2009

(87) PCT Pub. No.: WO2007/066960
PCT Pub. Date: Jun. 14, 2007

(65) Prior Publication Data
US 2010/0014866 A1 Jan. 21, 2010

(30) Foreign Application Priority Data

Dec. 5, 2005 (KR) .................. 10-2005-0117735
Nov. 15, 2006 (KR) .................. 10-2006-0112887

(51) Int. Cl.
*H04B 10/69* (2013.01)
(52) U.S. Cl.
CPC .................. *H04B 10/6931* (2013.01)
USPC ........................................ 398/210
(58) Field of Classification Search
USPC ........................................ 398/210
See application file for complete search history.

(56) References Cited

U.S. PATENT DOCUMENTS

| 6,115,163 A | 9/2000 | Nobuhara |
| 6,169,619 B1 | 1/2001 | Ide |

(Continued)

FOREIGN PATENT DOCUMENTS

| JP | 2000-151290 A | 5/2000 |
| JP | 2000-252774 A | 9/2000 |

(Continued)

OTHER PUBLICATIONS

"A Burst-Mode Receiver for 1.25-Gb/s Ethernet PON With AGC and Internally Created Reset Signal," *IEEE Journal of Solid-State Circuits*, vol. 39, No. 12, Dec. 2004, pp. 2379-2388.
"A 1.25-Gb/s CMOS Burst-Mode Optical Transceiver for Ethernet PON System," *IEEE Journal of Solid-State Circuits*, vol. 40, No. 4, Apr. 2005, pp. 1027-1034.

*Primary Examiner* — Shi K Li
(74) *Attorney, Agent, or Firm* — Blakely Sokoloff Taylor & Zafman

(57) ABSTRACT

A transimpedance amplifier for a burst mode optical communication converts a burst current signal into differential output voltage signals. Using a multi-level digital AGC mechanism, the transimpedance amplifier is rapidly adapted to a burst signal whose amplitude varies in a wide range. By using an adaptive level detection method, a multi-level digital AGC can be implemented without using ADC. In addition, because the transimpedance amplifier uses a selective reset generation scheme that performs a reset operation for itself after a high power burst, a burst mode operation can be performed without external reset signals. Accordingly, the transimpedance amplifier can be integrated with an optical detector within a TO-can. Furthermore, the transimpedance amplifier can have the burst mode capability and the best sensitivity.

15 Claims, 5 Drawing Sheets

(56) References Cited

U.S. PATENT DOCUMENTS

| | | |
|---|---|---|
| 6,246,282 B1 | 6/2001 | Oono et al. |
| 6,909,082 B2 | 6/2005 | Doh et al. |
| 6,911,644 B2 | 6/2005 | Doh et al. |
| 7,330,670 B2 * | 2/2008 | Doh et al. .................... 398/209 |
| 2004/0145419 A1 | 7/2004 | Nogami et al. |
| 2004/0190912 A1 * | 9/2004 | Seo et al. ..................... 398/202 |
| 2004/0199012 A1 | 10/2004 | Lee et al. |

FOREIGN PATENT DOCUMENTS

| | | |
|---|---|---|
| JP | 2000-315923 A | 11/2000 |
| JP | 2003-243955 A | 8/2003 |
| KR | 10-0640413 | 10/2006 |

\* cited by examiner

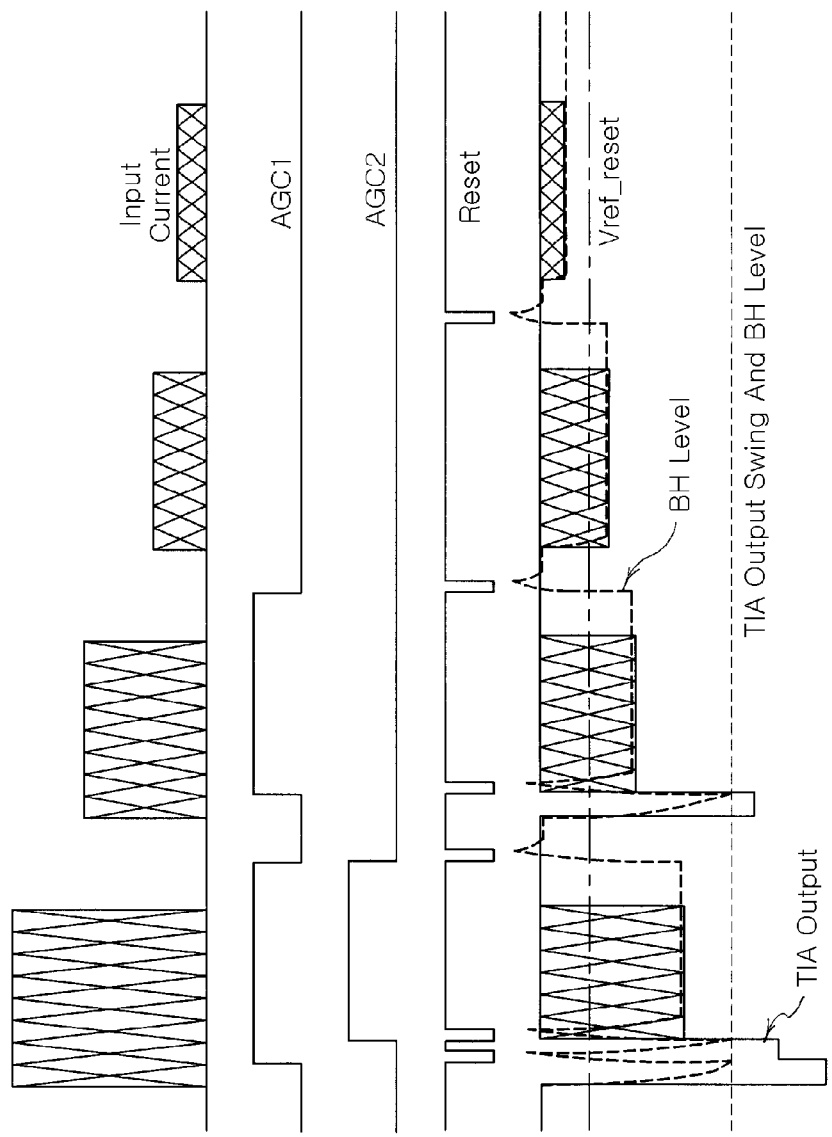

DIGITAL AUTOMATIC GAIN CONTROL APPARATUS AND METHOD IN BURST MODE OPTICAL RECEIVER

This is a non-provisional application claiming the benefit of International application number PCT/KR2006/005213 filed Dec. 5, 2006.

TECHNICAL FIELD

The present invention relates to a receiver of a passive optical network system in a digital optical communication, and more particularly, to a digital automatic gain control apparatus and method in a burst mode optical receiver of a passive optical network system performing a burst mode transmission.

BACKGROUND ART

Time Division Multiple Access (TDMA) using a high-speed packet signal for high-speed multimedia signal transmission has been actively studied. One of techniques for high-speed packet service is an optical subscriber network for efficiently providing various multimedia contents. Such an optical subscriber network uses a passive optical network (PON) technique.

In the PON technique, a single optical line terminal (OLT) and a plurality of optical network units (ONUs) are configured in a point-to-point (PTP) scheme. The PON technique is classified into APON (or BPON), EPON, and GPON according to protocols. The APON (ATM-PON) technique is based on an ATM protocol. The EPON (Ethernet-PON) technique provides uplink/downlink bandwidth of up to 1 Gbps through a cheap Ethernet and efficiently provides an Internet Protocol (IP) service through an Ethernet frame having a variable length. Gigabit-PON (GPON) efficiently transmits variable-length IP service and TDM service using a newly defined GPON encapsulation method (GEM) frame structure. In addition, the GPON transmits an ATM protocol without any additional overhead.

In order to reduce a subscriber cost, a central station of the PON system uses a single optical receiver to receive packet signals from a plurality of subscribers. Therefore, the received packet signals have different magnitudes and phases. These signals are referred to as burst signals. The burst signals are received through a burst mode receiver.

In a conventional PTP optical communication system, a decision threshold voltage is fixed to a constant by analog (AC) coupling an output of a linear channel to a decision circuit. In order to receive burst data using the optical receiver, an idle time must increase between packets. The idle time is a sum of a guard time and a preamble time. However, if the idle time increases, a packet transmission efficiency is reduced. When a capacity of a coupling condenser is reduced in order to decrease the idle time, another device for encoding/decoding outgoing data is required. In recent years, burst mode receivers have been developed which can process a plurality of different input signals within a short idle time and have a wide dynamic range.

According to the APON and GPON standards, the burst mode receiver has an external reset signal provided from a higher network layer. However, according to the EPON standard, the burst mode receiver has no external reset signal. In addition, an automatic gain controller (AGC) of the burst mode receiver forms a feedback loop to continuously control a gain of a transimpedance amplifier (TIA) according to an input level. Therefore, a frequency response of the TIA is affected by a characteristic of the feedback loop having a high sensitivity with respect to a process variation. The frequency response of the TIA is not smooth but flat in an entire operation range, causing a poor waveform in the output of the TIA. The burst mode receiver having the burst-based AGC using the external reset signal is not suitable for the EPON standard because the EPON system does not provide a reset.

Therefore, the PON system needs to generate the reset signal inside the receiver in order to obtain a high dynamic range within a short guard time. However, the conventional burst-based AGC and burst mode receiver are not suitable for application to an internal TO-can assembly because they have an internal reset signal have a large chip size.

DISCLOSURE OF INVENTION

Technical Problem

Embodiments of the present invention are directed to provide a digital AGC apparatus and method of a TIA, which are associated with a selective internal reset generation after burst in a burst mode receiver of a PON system.

Technical Solution

According to one aspect of the present invention, in a burst mode optical receiver having an optical detector and a transimpedance amplifier for converting an output current signal of the optical detector into a voltage signal, a digital automatic gain control method includes: detecting a bottom holding level of the outputted voltage signal when a burst begins; generating a reset signal using a reference voltage generated according to an output signal of the transimpedance amplifier; comparing the detected bottom holding level with an input signal; and controlling a gain of the transimpedance amplifier by generating an automatic gain control signal according to the comparison result.

According to another aspect of the present invention, in a burst mode optical receiver having an optical detector and a transimpedance amplifier for converting an output current signal of the optical detector into a voltage signal, a digital automatic gain control apparatus includes: an automatic gain controller for detecting a bottom holding level of the outputted voltage signal when a burst begins, controlling a gain of the transimpedance amplifier by generating at least one automatic gain control signal according to the detected bottom holding level, and generating a reset signal using a reference voltage generated according to an output signal of the transimpedance amplifier; a comparator for comparing the detected bottom holding level with an input voltage, generating a first comparison signal notifying if the automatic gain controller is enabled to generate the reset signal, generating a second comparison signal to enable the reset signal to be generated using the reference voltage, and comparing the detected bottom holding level with the input voltage to output a third comparison signal to enable the automatic gain controller to generate the automatic gain control signal; and a reference voltage generator for generating the reference voltage to the comparator.

Advantageous Effects

According to the present invention, because the reset signal is selectively generated inside the optical receiver, a simple reset generator can be integrated into a small-sized chip. The dynamic range and the loud/soft ratio of the input signal can be extended, while maintaining the rapid response. The TIA and the optical detector can be assembled in a small housing, and the sensitivity of the TIA is improved.

BRIEF DESCRIPTION OF THE DRAWINGS

FIG. 5 illustrates a signal timing waveform of a digital automatic gain controller according to an embodiment of the present invention.

BEST MODE FOR CARRYING OUT THE INVENTION

Figure 1:
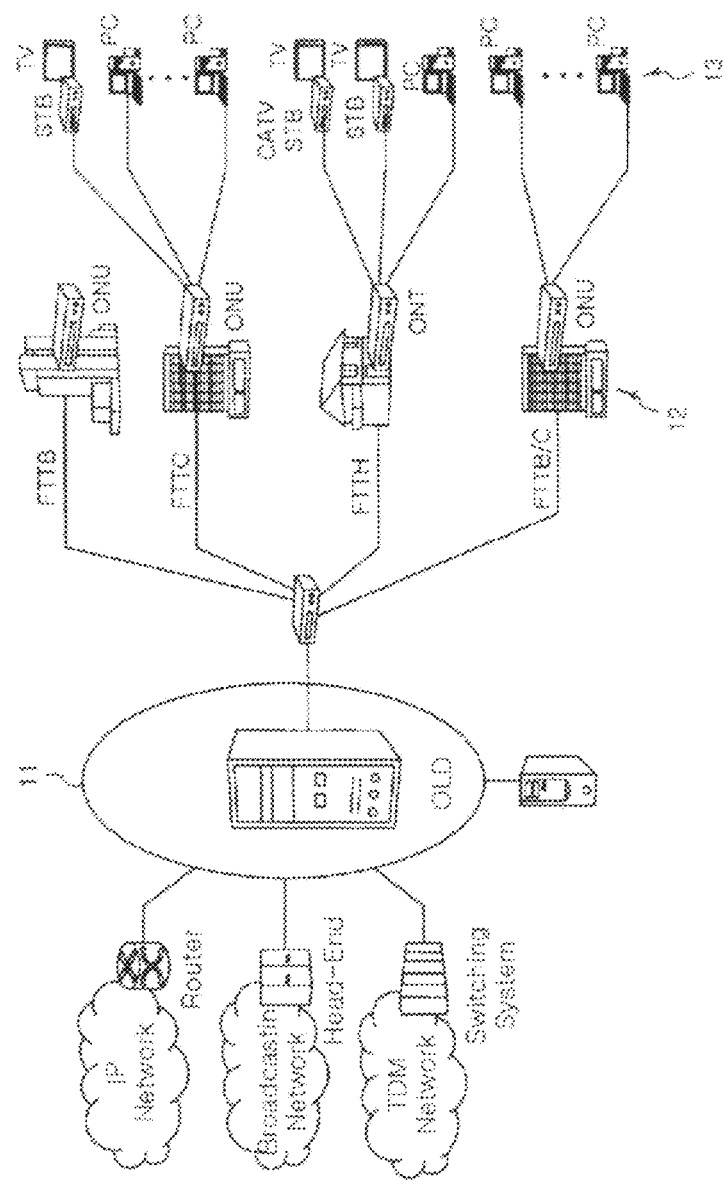
FIG. 1 illustrates a configuration of a PON system according to an embodiment of the present invention.

Exemplary embodiments of the present invention will be described below in detail with reference to the accompanying drawings. Like reference numerals are used to refer to like elements throughout the drawings. In the following description, well-known functions or constructions are not described in detail since they would obscure the invention in unnecessary detail.

Hereinafter, an EPON system will be described as an example of a PON system applied to a digital optical communication technology.

FIG. 1 illustrates a configuration of a PON system according to an embodiment of the present invention.

Referring to FIG. 1, the PON system includes an optical line terminal (OLT) 11 and an optical network unit (ONU) 12. The OLT 11 connects the PON system to another system, e.g., an IP network, a broadcasting network, a TDM network, etc. The ONU 12 is disposed at an end of a subscriber side of an optical subscriber network and is connected to a subscriber terminal 13, e.g., an STB, a PC, etc. The OLT 11 and the ONU 12 are disposed in both ends of the system and have keys distributed for the security of a communication channel.

The PON system applies to a subscriber terminal in a point-to-multipoint tree structure by using a single optical fiber. In the EPON system, an optical signal is split by an optical start coupler/splitter according to whether direction of light is upward or downward. The split optical signals are applied on a plurality of optical fibers, or they are combined and transmitted through a single optical fiber. As an example, an uplink signal transmission will be described.

Figure 2:
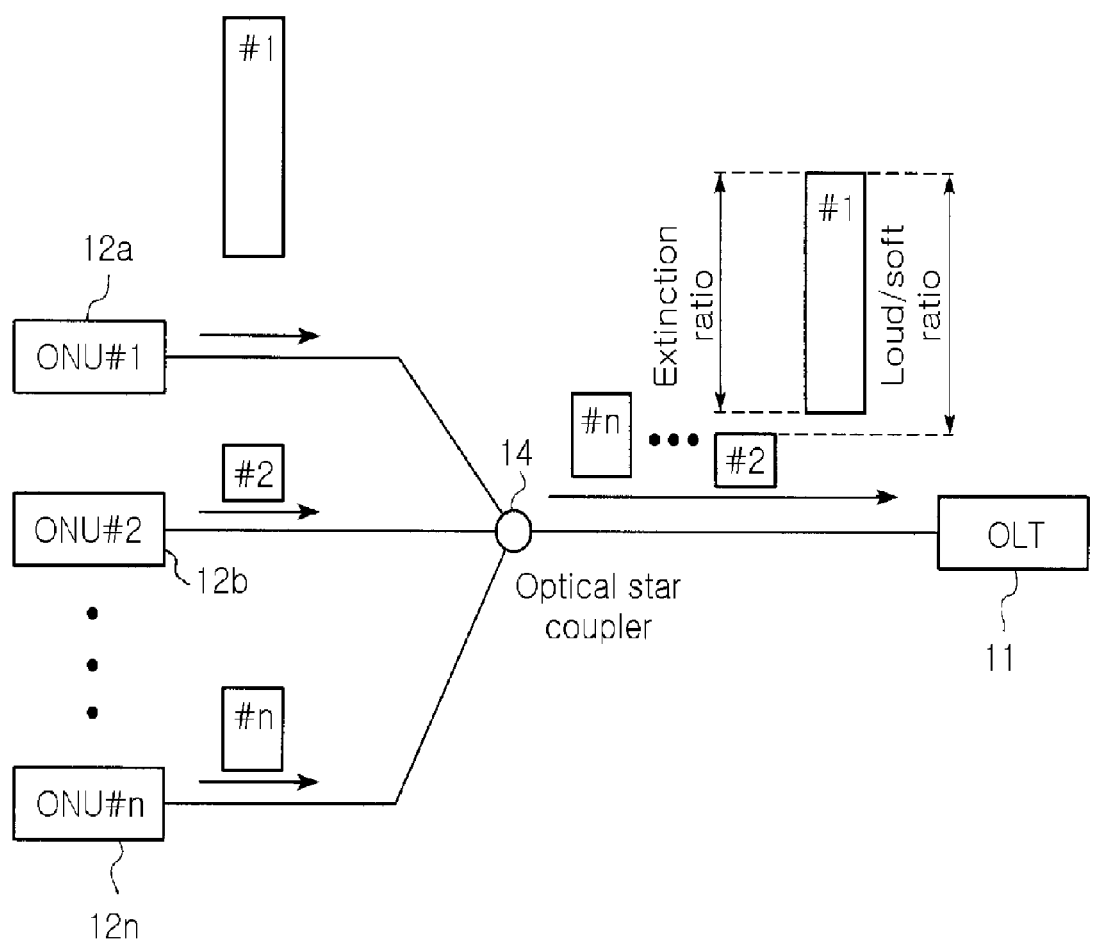
FIG. 2 illustrates an uplink signal transmission in a PON system according to an embodiment of the present invention.

FIG. 2 illustrates an uplink signal transmission in a PON system according to an embodiment of the present invention.

Referring to FIG. 2, in an uplink path of the PON system, each of ONUs 12 is assigned to a time slot dynamically or fixedly and transmits the signals to a common OLT 11. An ONU 12a adjacent to the OLT 11 can have a higher signal than ONUs 12b, . . . , 12n distant from the OLT 11. Optical signals #1, #2, . . . , #n outputted from the ONUs 12 are multiplexed in an optical star coupler 14 and transmitted to the OLT 11. When a loud/soft ratio is high, the burst mode optical receiver located at the OLT 11 is reset to an initial state before each burst arrives, so that the burst signals having different amplitude (magnitude and phase) are processed. The loud/soft ratio means a difference between a maximum level of a burst having the greatest magnitude and a maximum level of a burst having the smallest magnitude. The optical signals (packet signals) transmitted from the ONUs 12 are received through a single optical receiver in order to reduce a cost.

The optical receiver (the burst mode receiver) for generating the reset signal from the inside in order to process the burst signals having different amplitudes and performing the digital AGC will be described below in detail with reference to the accompanying drawings.

Figure 3:
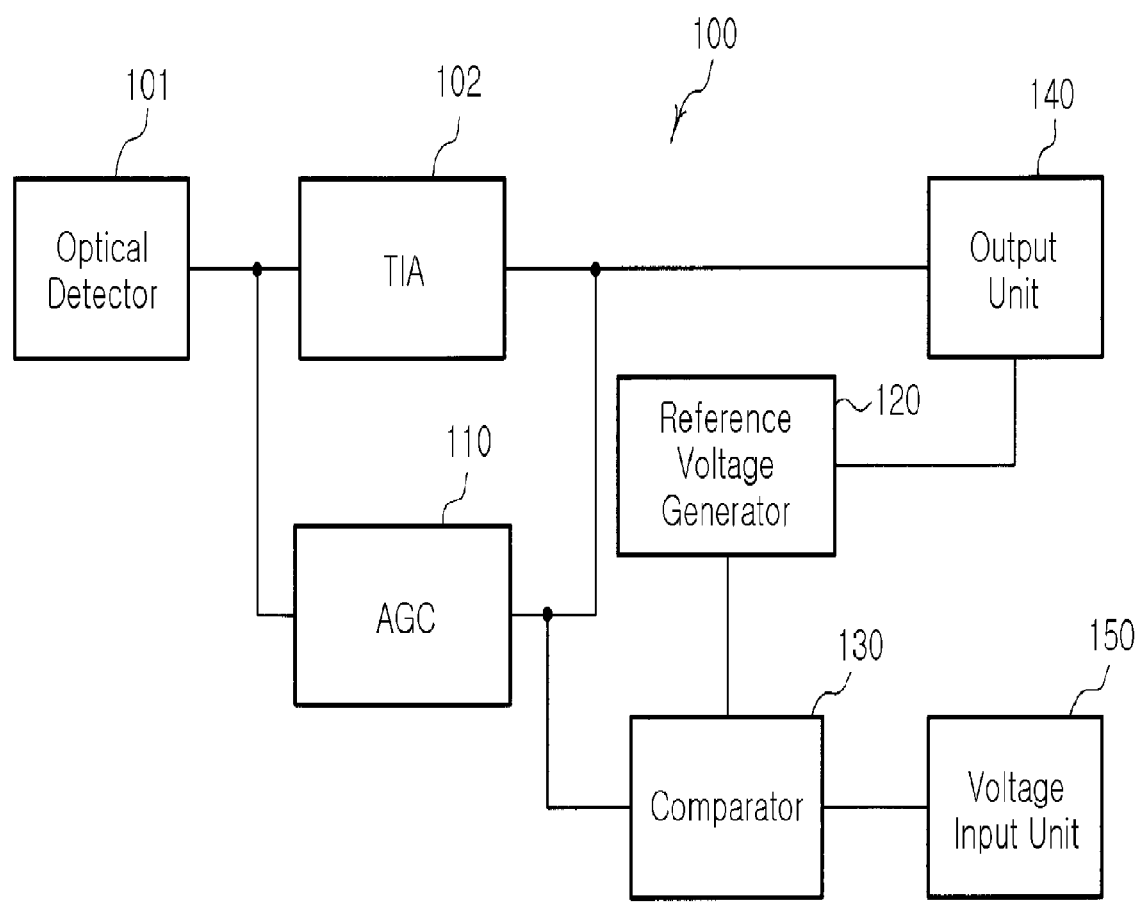
FIG. 3 illustrates an optical receiver in a PON system according to an embodiment of the present invention.
Figure 4:
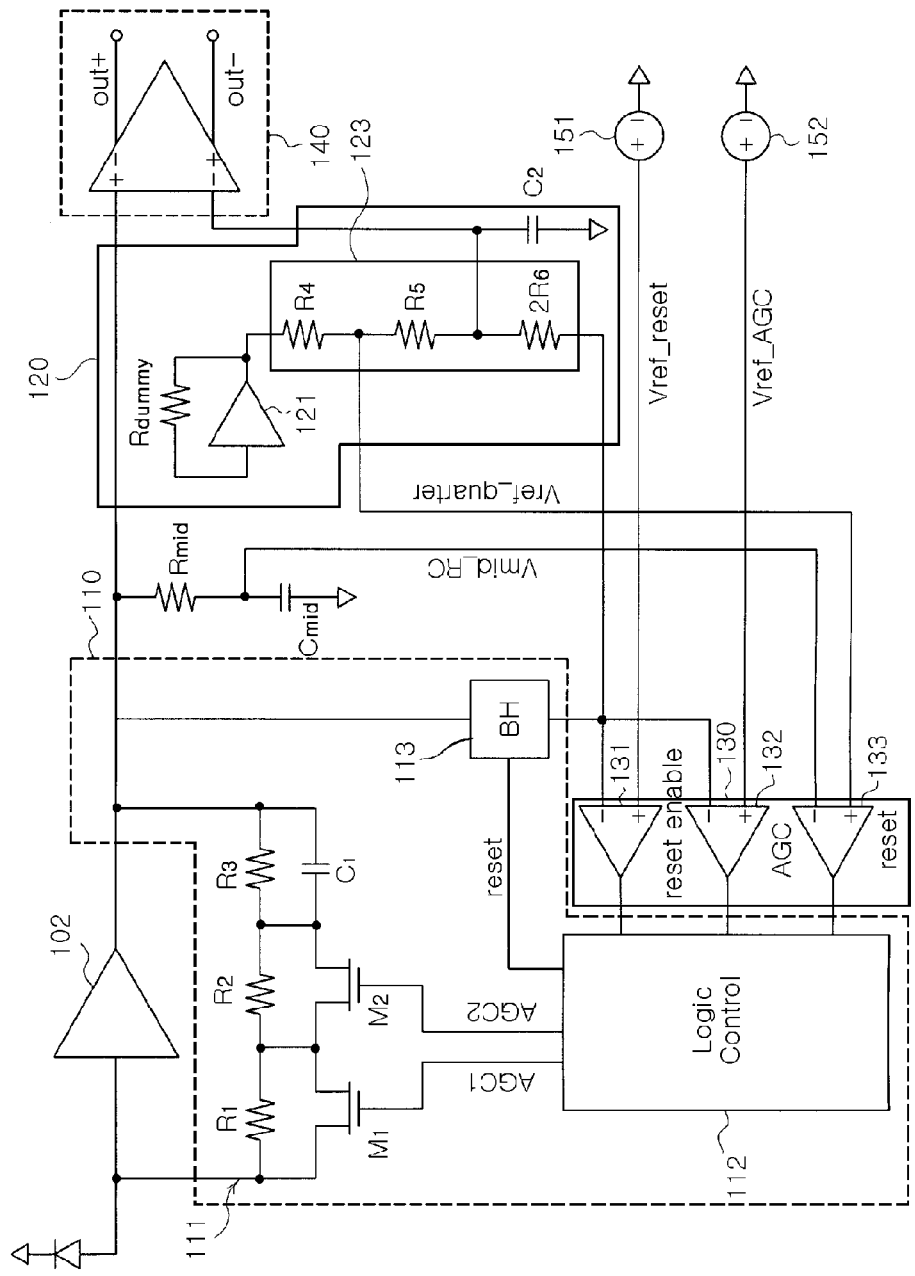
FIG. 4 illustrates an internal circuit configuration of an optical receiver according to an embodiment of the present invention.

FIG. 3 illustrates the optical receiver in the PON system according to an embodiment of the present invention, and FIG. 4 illustrates an internal circuit configuration of the optical receiver according to an embodiment of the present invention.

Referring to FIG. 3, the optical receiver 100 includes an optical detector 101, a transimpedance amplifier PITA) 102, an automatic gain controller (AGC) 110, a reference voltage generator 120, a comparator 130, an output unit 140, and a voltage input unit 150.

Referring to FIG. 4, the TIA 102 converts an output current of the optical detector 101 into a voltage and amplifies it. The TIA 102 receives a feedback signal from the AGC 110. A resistor Rmid and a capacitor Cmid are connected to an output terminal of the TIA 102. The resistor Rmid and the capacitor Cmid track the output signal of the TIA 102 to generate a tracking voltage Vmid_RC. The tracking voltage Vmid_RC is an approximately middle value of an output swing of a pre-amplifier. This value gradually increases after burst and follows the output of the TIA 102.

The AGC 110 includes a feedback circuit 111, a logic controller 112, and a bottom holding circuit 113. The feedback circuit 111 feeds back an output voltage of the TIA 102. The logic controller 112 controls the feedback circuit 111 by generating the AGC signal for controlling the gain of the TIA 102. The bottom holding circuit 113 detects and holds a bottom level of the output swing of the TIA 102.

The feedback circuit 111 includes a first transistor M1 for performing a switching operation in response to a first AGC signal AGC1 outputted from the logic controller 112, a second transistor M2 for performing a switching operation in response to a second AGC signal AGC2, serially connected resistors R1, R2 and R3, and capacitors C1. The serially connected resistors R1, R2 and R3 are connected in parallel to the first and second transistors M1 and M2. The capacitor C1 is serially connected to the second transistor M2, connected in parallel to the resistor R3, and connected to the output terminal of the TIA 102.

The logic controller 112 receives the output signal of the comparator 130 to output the first and second AGC signals AGC1 and AGC2 for controlling the gain of the TIA 102 and to output the reset signal to the bottom holding circuit 113.

The bottom holding circuit 113 is connected to the output terminal of the TIA 102 and the logic controller 112, thereby forming a parallel structure together with the feedback circuit 111.

The reference voltage generator 120 includes a dummy amplifier 112 connected in parallel to a dummy resistor Rdummy, and a voltage divider 123. An output of the dummy amplifier 121 is connected to an output of the bottom holding circuit 113 by the voltage divider 123, thereby generating a substantially middle value of the output swing of the TIA 102 and a reference voltage Vref_quarter lower than the output swing by ¼. The middle value is provided as a reference voltage of the output unit 140.

Resistors R4, R5 and R6 of the voltage divider 123 are serially connected to the output terminal of the dummy amplifier 121. The dummy amplifier 121 is a duplicate of the TIA 102. Because the dummy amplifier 121 is not connected to any input signal, the output voltage of the dummy amplifier 121 is equal to that of the TIA 102 when there are no input signals. The output voltage of the dummy amplifier 121 is called Vdark.

Both ends of the resistor R5 are connected to the output unit 140 to generate the middle value and are connected to the comparator 130 to provide the reference voltage. The resistor 2R6 is connected in parallel to the capacitor C2 connected to the output unit 140.

The comparator 130 includes a reset enable comparator 131, an AGC comparator 132, and a reset comparator 133.

The reset enable comparator 131 compares the bottom holding level with the input voltage Vref_reset to generate a reset enable signal RESET_ENABLE to the logic controller 112. A negative (−) terminal of the reset enable comparator 131 is connected to the bottom holding circuit 113 and the voltage divider 123, and a positive (+) terminal of the reset enable comparator 131 is connected to an input terminal 151.

The AGC comparator 132 compares the bottom holding level with the input voltage Vref_AGC to output the compared signal to the logic controller 112. A negative terminal of the AGC comparator 132 is connected to the bottom holding circuit 113, and the positive terminal of the AGC comparator 132 is connected to an input terminal 152.

The reset comparator 133 compares the tracking voltage Vmid_RC with the reference voltage Vref_quarter. The output signal of the reset comparator 133 is a total reset signal.

The output unit 140 is implemented with a converter that is a differential amplifier having a positive terminal receiving the output signal of the TIA 102, a negative terminal receiving the middle value from the voltage divider 123, and two output terminals. The converter of the output unit 140 converts the output signal of the TIA 102 into symmetrical differential signals and amplifies the differential signals. A limited output signal is generated when the input signal applied to the output terminal is amplified, the amplitude of the input signal is greater than a predefined value, and the level of the input signal is in a predetermined range with respect to the reference voltage applied to the reference voltage input terminal.

The output matching block implemented with a 50 W load in order to provide 50 W output matching in a broadband. The output of the TIA 102 is connected to an external limiting amplifier (not shown) directly or by a coupling capacitor.

The operation of controlling the gain of the TIA and generating the reset signal in the optical receiver will be described below.

Referring again to FIG. 4, the optical detector 101 detects an optical signal and converts the detected optical signal into the output current signal. The current signal is inputted to the TIA 102, is converted into a voltage, and then is amplified. The bottom holding circuit 113 detects the bottom level of the output swing from the TIA 102 and holds the detected bottom level. A 1:1 resistive voltage divider with the dummy amplifier detects a substantially middle value of the output swing of the pre-amplifier. In addition, the output signal of the TIA 102 is inputted to the output unit 140. In the differential amplifier of the output unit 140, one of the input terminals is biased at the output terminal in the middle of the voltage waveform and differentiates the signal and is symmetrical with very small offset.

The logic controller 110 outputs the first and second AGC signals AGC1 and AGC2 of a low level before the burst. At this time, the TIA 102 has the maximum gain. When the burst begins, the bottom holding circuit 113 detects the bottom value of the TIA 102. The detected bottom value becomes the burst output level. The AGC comparator 132 compares the burst output level from the bottom holding circuit 113 with the input voltage Vref_AGC. When the burst output level is lower than the input voltage Vref_AGC, the AGC comparator 132 outputs a high signal. The logic controller 112 outputs the first AGC signal AGC1 of a high level so that the gain of the TIA 102 is reduced through the feedback circuit 113.

The logic controller 112 resets the bottom holding circuit 113 by generating a reset pulse according to the signal outputted through the comparison of the tracking voltage Vmid_RC from the reset comparator 133 and the reference voltage Vref_quarter. During the reset operation, the bottom holding circuit 113 boosts the bottom holding level so that the output of the AGC comparator 132 can go to a low level. After the reset operation, the bottom holding circuit 113 detects a new bottom holding level and outputs the detected bottom holding level to the AGC comparator 132. The AGC comparator 132 compares the bottom holding level with the input voltage Vref_AGC. When the new bottom holding level is lower than the input voltage Vref_AGC, the AGC comparator 132 outputs a high signal one more. Because the logic controller 112 outputs the second AGC signal AGC2 of a high level, the feedback circuit 111 further reduces the gain of the TIA 102. Then, the logic controller 112 generates the reset pulse. The same procedure can be applied to AGC levels exceeding 2. The waveform and timing are illustrated in FIG. 5.

Referring to FIG. 2, during the operation of the optical receiver, the bottom holding circuit 113 needs to be set to the initial state by the reset signal after the burst, so that it can detect the bottom holding level of the low power burst. Therefore, the reset signal is required only after the high power burst signal. When the burst begins, the reset enable comparator 131 compares the detected bottom holding level with the input voltage Vref_reset. In the high power, that is, when the bottom holding level is lower than the input voltage Vref_reset, the reset enable comparator 131 set the output of the comparator to a high level, enabling the generation of the reset after the burst.

Meanwhile, after the burst, the tracking voltage Vmid_RC goes up to Vdark and passes the reference voltage Vref_quarter lower than Vdark by ¼ of the output swing of the TIA 102. After the passing position, because the output of the reset comparator 133 rises to a high level, the logic controller 112 generates a pulse for the bottom holding circuit 113 and sets the first and second AGC signals AGC1 and AGC2 to a low level.

The bottom holding level becomes close to Vdark after resetting the bottom holding circuit 113. As a result of the comparison of the reset enable comparator 131, the reset enable signal becomes low. Therefore, the reset does not occur until a next burst arrives. That is, the reset does not occur when the bottom holding level is not so low as to turn on the reset enable signal because the burst is a low power. Therefore, although a predetermined amount of residual offset can be used between consecutive low power bursts, it is small enough not to saturate the output block. A calculation of a reference value is needed in order to prevent the saturation.

In order to prevent the total reset signal from being a high level during the AGC operation of the logic controller 112, the reset enable signal RESET_ENABLE is delayed for a sufficiently long time after the burst begins.

According to the present invention, the high-speed operation can be achieved at a low cost and the data rate of up to Gbps can be obtained. Also, the present invention can obtain the excellent operation of a clock and data recovery circuit. In addition, because the burst mode optical receiver has a small TIA chip size suitable for the internal TO-can assembly, it can obtain a higher sensitivity than the PIN-PD optical detector. Therefore, the present invention is suitable for the fabrication of the small-sized burst mode receiver module using the symmetrical differential output signals in terms of commercial limiting amplifier, AC coupling capacitor and noise immunity.

The multi-level digital AGC operation can be performed in the burst mode TIA. The dynamic range and the loud/soft ratio of the input signal can be extended, while maintaining the rapid response. In addition, the digital AGC method can prevent the effect of the AGC loop in the frequency response of the TIA. The selective reset generation can allow the simple reset generator to be integrated into a small-sized chip. Therefore, the TIA and the optical detector can be assembled in a small housing, and the sensitivity of the TIA is improved. Moreover, the burst mode receiver module can be fabricated using the TIA chip having a general limiting amplifier according to the reset generation inside the TIA chip.

The invention claimed is:

1. A digital automatic gain control method in a burst mode optical receiver having an optical detector and a transimpedance amplifier for converting an output current signal of the optical detector into a voltage signal, the digital automatic gain control method comprising:
   detecting a bottom holding level of the outputted voltage signal when a burst begins;
   comparing the detected bottom holding level with an input signal;
   controlling a gain of the transimpedance amplifier by generating an automatic gain control signal according to the comparison result, and
   comparing a tracking voltage (Vmid_RC) of the transimpedance amplifier with a reference voltage (Vref_quarter) generated between the bottom holding level and an output level of a dummy amplifier through a resistive divided voltage and generating a reset signal according to the comparison result.

2. The digital automatic gain control method according to claim 1, further comprising:
   detecting a new bottom holding level when the reset signal is generated;
   comparing the detected new bottom holding level with the input signal; and
   controlling a generation of another automatic gain control signal according to the comparison result.

3. The digital automatic gain control method according to claim 1, wherein in the controlling of the gain of the transimpedance amplifier, when the detected bottom holding level is lower than the input signal and a high signal is outputted, at least one switch is closed by outputting one automatic gain control signal of a high level and the gain of the transimpedance amplifier is reduced.

4. The digital automatic gain control method according to claim 3, wherein in the controlling of the generation of the automatic gain control signal, when the new bottom holding level is lower than the input signal, another switch is closed by outputting the another automatic gain control signal of a high level and the gain of the transimpedance amplifier is further reduced.

5. The digital automatic gain control method according to claim 1, further comprising stopping the generation of the reset signal until a next burst arrives, when a circuit for detecting the bottom holding level is reset after the generation of the reset signal and a reset enable signal of a low level is generated.

6. The digital automatic gain control method according to claim 5, wherein the reference voltage (Vref_quarter) has a middle value of the output signal of the transimpedance amplifier, the middle value being lower than Vdark by ¼.

7. A digital automatic gain control apparatus in a burst mode optical receiver having an optical detector and a transimpedance amplifier for converting an output current signal of the optical detector into a voltage signal, the digital automatic gain control apparatus comprising:
   an automatic gain controller for detecting a bottom holding level of the outputted voltage signal when a burst begins, controlling a gain of the transimpedance amplifier by generating at least one automatic gain control signal according to the detected bottom holding level, and generating a reset signal using a reference voltage generated according to an output signal of the transimpedance amplifier;
   a comparator for comparing the detected bottom holding level with a first input voltage, generating a first comparison signal notifying if the automatic gain controller is enabled to generate the reset signal, generating a second comparison signal to enable the reset signal to be generated using the reference voltage, and comparing the detected bottom holding level with a second input voltage to output a third comparison signal to enable the automatic gain controller to generate the automatic gain control signal; and
   a reference voltage generator for generating the reference voltage to the comparator.

8. The digital automatic gain control apparatus according to claim 7, wherein the automatic gain controller comprises:
   a bottom holding circuit for detecting the bottom holding level through the output signal of the transimpedance amplifier;
   a logic controller for generating the reset signal and the at least one automatic gain control signal according to the comparison signals; and
   a feedback circuit for controlling the gain of the transimpedance amplifier through the at least one automatic gain control signal.

9. The digital automatic gain control apparatus according to claim 8, wherein the logic controller generates the reset signal to the bottom holding circuit when the first and second comparison signals are high.

10. The digital automatic gain control apparatus according to claim 8, wherein the logic controller generates one automatic gain control signal of a high level to close at least one switch when the third comparison signal is high, and reduces the gain of the transimpedance amplifier.

11. The digital automatic gain control apparatus according to claim 10, wherein the logic controller closes another switch by generating another automatic gain control signal of a high level when the third comparison signal compared according to a new bottom holding level detected by the bottom holding circuit is high after the bottom holding circuit is reset, and further reduces the gain of the transimpedance amplifier.

12. The digital automatic gain control apparatus according to claim 8, wherein the logic controller stops the generation of the reset signal until a next burst arrives, when the first comparison signal is low after the bottom holding circuit is reset.

13. The digital automatic gain control apparatus according to claim 8, wherein the reference voltage generator generates a tracking voltage (Vinid_RC) according to the output signal of the transimpedance amplifier, and generates a reference voltage (Vref_quarter) between the bottom holding level and an output level of a dummy amplifier through a resistive divided voltage.

14. The digital automatic gain control apparatus according to claim 13, wherein the comparator compares the reference voltage (Vref_quarter) with the tracking voltage (Vmid_RC)

after the burst, and outputs the second comparison signal to enabling the reset signal to be generated.

15. The digital automatic gain control apparatus according to claim 14, wherein the reference voltage (Vref_quarter) has a middle value of the output signal of the transimpedance amplifier, the middle value being lower than Vdark by ¼.

* * * * *